United States Patent
Fallon

(10) Patent No.: US 6,309,424 B1
(45) Date of Patent: Oct. 30, 2001

(54) CONTENT INDEPENDENT DATA COMPRESSION METHOD AND SYSTEM

(75) Inventor: James J. Fallon, Bronxville, NY (US)

(73) Assignee: Realtime Data LLC, New York, NY (US)

( * ) Notice: Subject to any disclaimer, the term of this patent is extended or adjusted under 35 U.S.C. 154(b) by 0 days.

(21) Appl. No.: 09/705,446

(22) Filed: Nov. 3, 2000

Related U.S. Application Data

(63) Continuation of application No. 09/210,491, filed on Dec. 11, 1998.

(51) Int. Cl.[7] .............................. H03M 7/34; H03M 7/38
(52) U.S. Cl. ............................................. 3410/51; 704/220
(58) Field of Search .................................. 341/51, 79, 60; 348/458; 386/96; 707/200; 375/240; 704/220; 710/68; 711/112; 382/253

(56) References Cited

U.S. PATENT DOCUMENTS

| | | |
|---|---|---|
| 4,872,009 | 10/1989 | Tsukiyama et al. . |
| 4,929,946 | 5/1990 | O Brien et al. . |
| 5,045,852 | 9/1991 | Mitchell et al. . |
| 5,097,261 | 3/1992 | Langdon, Jr. et al. . |
| 5,212,742 | 5/1993 | Normile et al. . |
| 5,231,492 | 7/1993 | Dangi et al. . |
| 5,243,341 | 9/1993 | Seroussi et al. . |
| 5,243,348 | 9/1993 | Jackson . |
| 5,270,832 | 12/1993 | Balkanski et al. . |
| 5,379,036 | 1/1995 | Storer . |
| 5,381,145 | 1/1995 | Allen et al. . |
| 5,394,534 | 2/1995 | Kulakowski et al. . |
| 5,461,679 | 10/1995 | Normile et al. . |
| 5,467,087 | 11/1995 | Chu . |
| 5,471,206 | 11/1995 | Allen et al. . |
| 5,479,587 | 12/1995 | Campbell et al. . |
| 5,486,826 | 1/1996 | Remillard . |
| 5,495,244 | 2/1996 | Je-Chang et al. . |
| 5,533,051 | 7/1996 | James . |
| 5,583,500 | 12/1996 | Allen et al. . |
| 5,627,534 | 5/1997 | Craft . |
| 5,654,703 | 8/1997 | Clark, II . |
| 5,668,737 | 9/1997 | Iler . |
| 5,717,393 | 2/1998 | Nakano et al. . |
| 5,717,394 | 2/1998 | Schwartz et al. . |
| 5,729,228 | 3/1998 | Franaszek et al. . |
| 5,748,904 | 5/1998 | Huang et al. . |
| 5,771,340 | 6/1998 | Nakazato et al. . |
| 5,784,572 | 7/1998 | Rostoker et al. . |

(List continued on next page.)

Primary Examiner—Patrick Wamsley
(74) Attorney, Agent, or Firm—Frank V. DeRosa; F. Chau & Associates, LLP

(57) ABSTRACT

Systems and methods for providing content independent lossless data compression and decompression. A data compression system includes a plurality of encoders that are configured to simultaneously or sequentially compress data independent of the data content. The results of the various encoders are compared to determine if compression is achieved and to determine which encoder yields the highest lossless compression ratio. The encoded data with the highest lossless compression ratio is then selected for subsequent data processing, storage, or transmittal. A compression identification descriptor may be appended to the encoded data with the highest compression ratio to enable subsequent decompression and data interpretation. Furthermore, a timer may be added to measure the time elapsed during the encoding process against an a priori-specified time limit. When the time limit expires, only the data output from those encoders that have completed the encoding process are compared. The encoded data with the highest compression ratio is selected for data processing, storage, or transmittal. The imposed time limit ensures that the real-time or pseudo real-time nature of the data encoding is preserved. Buffering the output from each encoder allows additional encoders to be sequentially applied to the output of the previous encoder, yielding a more optimal lossless data compression ratio.

13 Claims, 16 Drawing Sheets

U.S. PATENT DOCUMENTS

| | | |
|---|---|---|
| 5,799,110 | 8/1998 | Israelsen et al. . |
| 5,805,932 | 9/1998 | Kawashima et al. . |
| 5,809,176 | 9/1998 | Yajima . |
| 5,818,368 | 10/1998 | Langley . |
| 5,818,530 | 10/1998 | Canfield et al. . |
| 5,819,215 | 10/1998 | Dobson et al. . |
| 5,825,424 | 10/1998 | Canfield et al. . |
| 5,839,100 * | 11/1998 | Wegener .............................. 704/220 |
| 5,847,762 | 12/1998 | Canfield et al. . |
| 5,861,824 | 1/1999 | Ryu et al. . |
| 5,917,438 | 6/1999 | Ando . |
| 5,964,842 | 10/1999 | Packard . |
| 5,991,515 | 11/1999 | Fall et al. . |
| 6,031,939 | 2/2000 | Gilbert et al. . |
| 6,141,053 * | 10/2000 | Saukkonen ........................... 375/240 |

\* cited by examiner

CONTENT INDEPENDENT DATA COMPRESSION METHOD AND SYSTEM

Cross-Reference To Related Application

This application is a Continuation of U.S. patent application Ser. No. 09/210,491, filed on Dec. 11, 1998.

BACKGROUND

1. Technical Field

The present invention relates generally to a data compression and decompression and, more particularly, to systems and methods for providing content independent lossless data compression and decompression.

2. Description of the Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing, Continuous information such as speech, music, audio, images and video, frequently exists in the natural world as analog information. As is well-known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Lossy data compression techniques provide for an inexact representation of the original uncompressed data such that the decoded (or reconstructed) data differs from the original unencoded/uncompressed data. Lossy data compression is also known as irreversible or noisy compression. Entropy is defined as the quantity of information in a given set of data. Thus, one obvious advantage of lossy data compression is that the compression ratios can be larger than the entropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

There are various problems associated with the use of lossless compression techniques. One fundamental problem encountered with most lossless data compression techniques are their content sensitive behavior. This is often referred to as data dependency. Data dependency implies that the compression ratio achieved is highly contingent upon the content of the data being compressed. For example, database files often have large unused fields and high data redundancies, offering the opportunity to compress data at ratios of 5 to 1 or more. In contrast, concise software programs have little to no data redundancy and, typically, will not losslessly compress better than 2 to 1.

Another problem with lossless compression is that there are significant variations in the compression ratio obtained when using a single lossless data compression technique for data streams having different data content and data size. This process is known as natural variation.

A further problem is that negative compression may occur when certain data compression techniques act upon many types of highly compressed data. Highly compressed data appears random and many data compression techniques will substantially expand, not compress this type of data.

For a given application, there are many factors which govern the applicability of various data compression techniques. These factors include compression ratio, encoding and decoding processing requirements, encoding and decoding time delays, compatibility with existing standards, and implementation complexity and cost, along with the adaptability and robustness to variations in input data. A direct relationship exists in the current art between compression ratio and the amount and complexity of processing required. One of the limiting factors in most existing prior art lossless data compression techniques is the rate at which the encoding and decoding processes are performed. Hardware and software implementation tradeoffs are often dictated by encoder and decoder complexity along with cost.

Another problem associated with lossless compression methods is determining the optimal compression technique for a given set of input data and intended application. To combat this problem, there are many conventional content dependent techniques which may be utilized. For instance, filetype descriptors are typically appended to file names to describe the application programs that normally act upon the data contained within the file. In this manner data types, data structures, and formats within a given file may be ascertained. Fundamental problems with this content dependent technique are:

(1) the extremely large number of application programs, some of which do not possess published or documented file formats, data structures, or data type descriptors;

(2) the ability for any data compression supplier or consortium to acquire, store, and access the vast amounts of data required to identify known file descriptors and associated data types, data structures, and formats; and (3) the rate at which new application programs are developed and the need to update file format data descriptions accordingly.

An alternative technique that approaches the problem of selecting an appropriate lossless data compression technique is disclosed in U.S. Pat. No. 5,467,087 to Chu entitled "High Speed Lossless Data Compression System" ("Chu"). FIG. 1 illustrates an embodiment of this data compression and decompression technique. Data compression 1 comprises two phases, a data pre-compression phase 2 and a data compression phase 3. Data decompression 4 of a compressed input data stream is also comprised of two phases, a data type retrieval phase 5 and a data decompression phase 6. During the data compression process 1, the data pre-compressor 2 accepts an uncompressed data stream, identifies the data type of the input stream, and generates a data type identification signal. The data compressor 3 selects a data compression method from a preselected set of methods to compress the input data stream, with the intention of producing the best available compression ratio for that particular data type.

There are several problems associated with the Chu method. One such problem is the need to unambiguously identify various data types. While these might include such common data types as ASCII, binary, or unicode, there, in fact, exists a broad universe of data types that fall outside the three most common data types. Examples of these alternate data types include: signed and unsigned integers of various lengths, differing types and precision of floating point numbers, pointers, other forms of character text, and a multitude of user defined data types. Additionally, data types may be interspersed or partially compressed, making data type recognition difficult and/or impractical. Another problem is that given a known data type, or mix of data types within a specific set or subset of input data, it may be difficult and/or impractical to predict which data encoding technique yields the highest compression ratio.

Chu discloses an alternate embodiment wherein a data compression rate control signal is provided to adjust specific parameters of the selected encoding algorithm to adjust the compression time for compressing data. One problem with this technique is that the length of time to compress a given set of input data may be difficult or impractical to predict. Consequently, there is no guarantee that a given encoding algorithm or set of encoding algorithms will perform for all possible combinations of input data for a specific timing constraint. Another problem is that, by altering the parameters of the encoding process, it may be difficult and/or impractical to predict the resultant compression ratio.

Other conventional techniques have been implemented to address the aforementioned problems. For instance, U.S. Pat. No. 5,243,341 to Seroussi et al: describes a class of Lempel-Ziv lossless data compression algorithms that utilize a memory based dictionary of finite size to facilitate the compression and decompression of data. A second standby dictionary is included comprised of those encoded data entries that compress the greatest amount of input data. When the current dictionary fills up and is reset, the standby dictionary becomes the current dictionary, thereby maintaining a reasonable data compression ratio and freeing up memory for newly encoded data strings. Multiple dictionaries are employed within the same encoding technique to increase the lossless data compression ratio. This technique demonstrates the prior art of using multiple dictionaries within a single encoding process to aid in reducing the data dependency of a single encoding technique. One problem with this method is that it does not address the difficulties in dealing with a wide variety of data types.

U.S. Pat. No. 5,717,393 to Nakano, et al. teaches a plurality of code tables such as a high-usage code table and a low-usage code table in an entropy encoding unit. A block-sorted last character string from a block-sorting transforming unit is the move-to-front transforming unit is transformed into a move-to-front (MTF) code string. The entropy encoding unit switches the code tables at a discontinuous part of the MTF code string to perform entropy coding. This technique increases the compression rate without extending the block size. Nakano employs multiple code tables within a single entropy encoding unit to increase the lossless data compression ratio for a given block size, somewhat reducing the data dependency of the encoding algorithm. Again, the problem with this technique is that it does not address the difficulties in dealing with a wide variety of data types.

U.S. Pat. No. 5,809,176 to Yajima discloses a technique of dividing a native or uncompressed image data into a plurality of streams for subsequent encoding by a plurality of identically functioning arithmetic encoders. This method demonstrates the technique of employing multiple encoders to reduce the time of encoding for a single method of compression.

U.S. Pat. Nos. 5,583,500 and 5,471,206 to Allen, at al. disclose systems for parallel decompression of a data stream comprised of multiple code words. At least two code words are decoded simultaneously to enhance the decoding process. This technique demonstrates the prior art of utilizing multiple decoders to expedite the data decompression process.

U.S. Pat. No. 5,627,534 to Craft teaches a two-stage lossless compression process. A run length precompressed output is post processed by a Lempel-Ziv dictionary sliding window dictionary encoder that outputs a succession of fixed length data units. This yields a relatively high-speed compression technique that provides a good match between the capabilities and idiosyncrasies of the two encoding techniques. This technique demonstrates the prior art of employing sequential lossless encoders to increase the data compression ratio.

U.S. Pat. No. 5,799,110 to Israelsen, et al. discloses an adaptive threshold technique for achieving a constant bit rate on a hierarchical adaptive multistage vector quantization. A single compression technique is applied iteratively until the residual is reduced below a prespecified threshold. The threshold may be adapted to provide a constant bit rate output. If the nth stage is reached without the residual being less than the threshold, a smaller input vector is selected.

U.S. Pat. No. 5,819,215 to Dobson, et al. teaches a method of applying either lossy or lossless compression to achieve a desired subjective level of quality to the reconstructed signal. In certain embodiments this technique utilizes a combination of run-length and Huffman encoding to take advantage of other local and global statistics. The tradeoffs considered in the compression process are perceptible distortion errors versus a fixed bit rate output.

SUMMARY OF THE INVENTION

The present invention is directed to systems and methods for providing content independent lossless data compression and decompression. In one aspect of the present invention, a method for providing content independent lossless data compression comprises the steps of:

(a) receiving as input a block of data from a stream of data, the data stream comprising one of at least one data block and a plurality of data blocks;

(b) counting the size of the input data block;

(c) encoding the input data block with a plurality of lossless encoders to provide a plurality of encoded data blocks;

(d) counting the size of each of the encoded data blocks;

(e) determining a lossless data compression ratio obtained for each of the encoders by taking the ratio of the size of the encoded data block output from the encoders to the size of the input data block;

(f) comparing each of the determined compression ratios with an a priori user specified compression threshold;

(g) selecting for output the input data block and appending a null data type compression descriptor to the input data block, if all of the encoder compression ratios fall below the a priori specified compression threshold; and (h) selecting for output the encoded data block having the highest compression ratio and appending a corresponding data type compression descriptor to the selected encoded data block, if at least one of the compression ratios exceed the a priori specified compression threshold.

In another aspect of the present invention, a timer is preferably added to measure the time elapsed during the encoding process against an a priori-specified time limit. When the time limit expires, only the data output from those encoders that have completed the present encoding cycle are compared to determine the encoded data with the highest compression ratio. The time limit ensures that the real-time or pseudo real-time nature of the data encoding is preserved.

In another aspect of the present invention, the results from each encoder are buffered to allow additional encoders to be sequentially applied to the output of the previous encoder, yielding a more optimal lossless data compression ratio.

In another aspect of the present invention, a method for providing content independent lossless data decompression includes the steps of receiving as input a block of data from a stream of data, extracting an encoding type descriptor from the input data block, decoding the input data block with one or more of a plurality of available decoders in accordance with the extracted encoding type descriptor, and outputting the decoded data block. An input data block having a null descriptor type extracted therefrom is output without being decoded.

Advantageously, the present invention employs a plurality of encoders applying a plurality of compression techniques on an input data stream so as to achieve maximum compression in accordance with the real-time or pseudo real-time data rate constraint. Thus, the output bit rate is not fixed and the amount, if any, of permissible data quality degradation is not adaptable, but is user or data specified.

The present invention is realized due to recent improvements in processing speed, inclusive of dedicated analog and digital hardware circuits, central processing units, (and any hybrid combinations thereof), which, coupled with reductions in cost, are enabling of new content independent data compression and decompression solutions.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
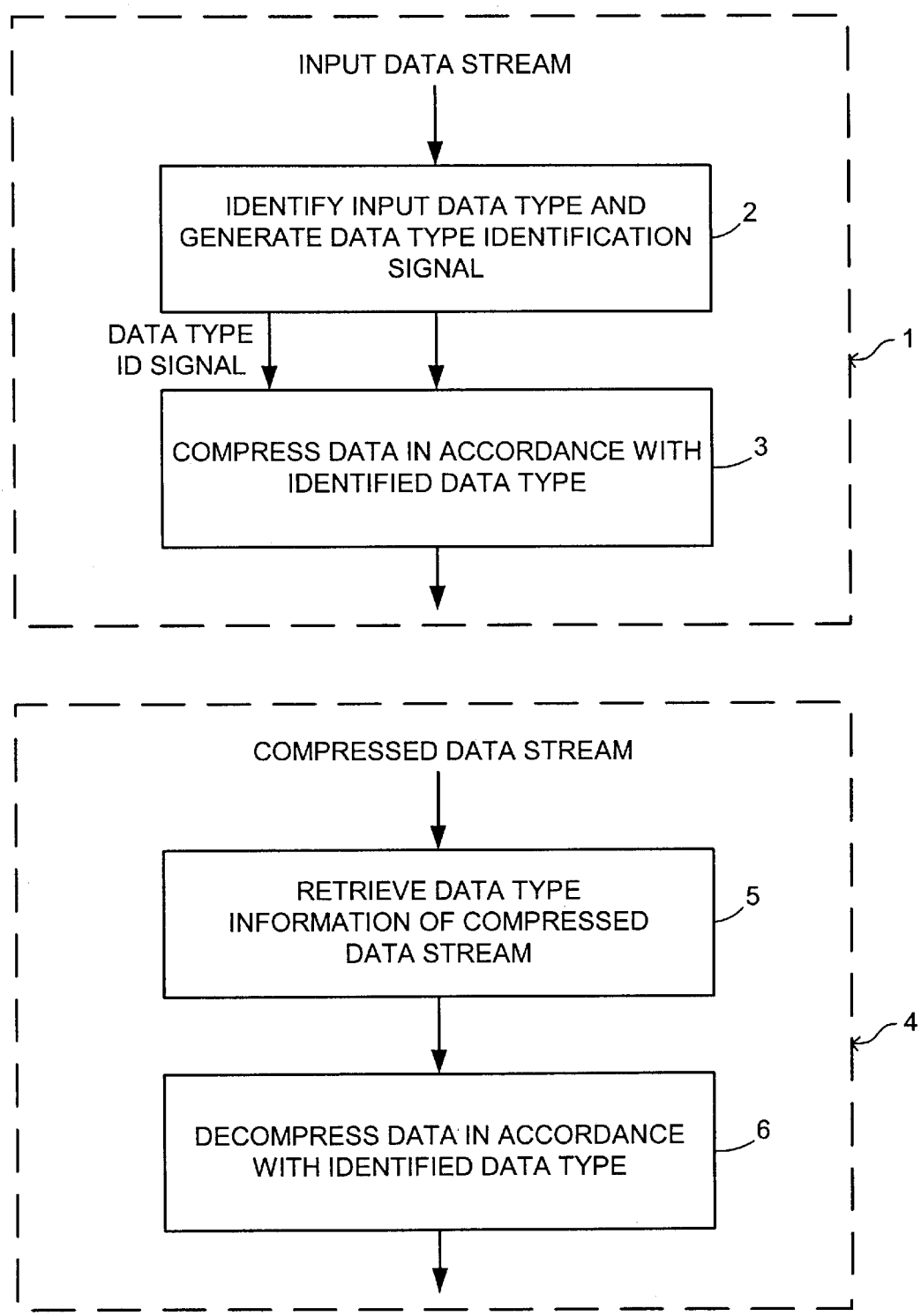
FIG. 1 is a block/flow diagram of a content dependent high-speed lossless data compression and decompression system/method according to the prior art.

The present invention is directed to systems and methods for providing content independent lossless data compression and decompression. In the following description, it is to be understood that system elements having equivalent or similar functionality are designated with the same reference numerals in the Figures. It is to be further understood that the present invention may be implemented in various forms of hardware, software, firmware, or a combination thereof. In particular, the system modules described herein are preferably implemented in software as an application program which is loaded into and executed by a general purpose computer having any suitable and preferred microprocessor architecture. Preferably, the present invention is implemented on a computer platform including hardware such as one or more central processing units (CPU), a random access memory (RAM), and input/output (I/O) interface(s). The computer platform also includes an operating system and microinstruction code. The various processes and functions described herein may be either part of the microinstruction code or application programs which are executed via the operating system. In addition, various other peripheral devices may be connected to the computer platform such as an additional data storage device and a printing device.

It is to be further understood that, because some of the constituent system components described herein are preferably implemented as software modules, the actual system connections shown in the Figures may differ depending upon the manner in which the systems are programmed. It is to be appreciated that special purpose microprocessors may be employed to implement the present invention. Given the teachings herein, one of ordinary skill in the related art will be able to contemplate these and similar implementations or configurations of the present invention.

Figure 2:
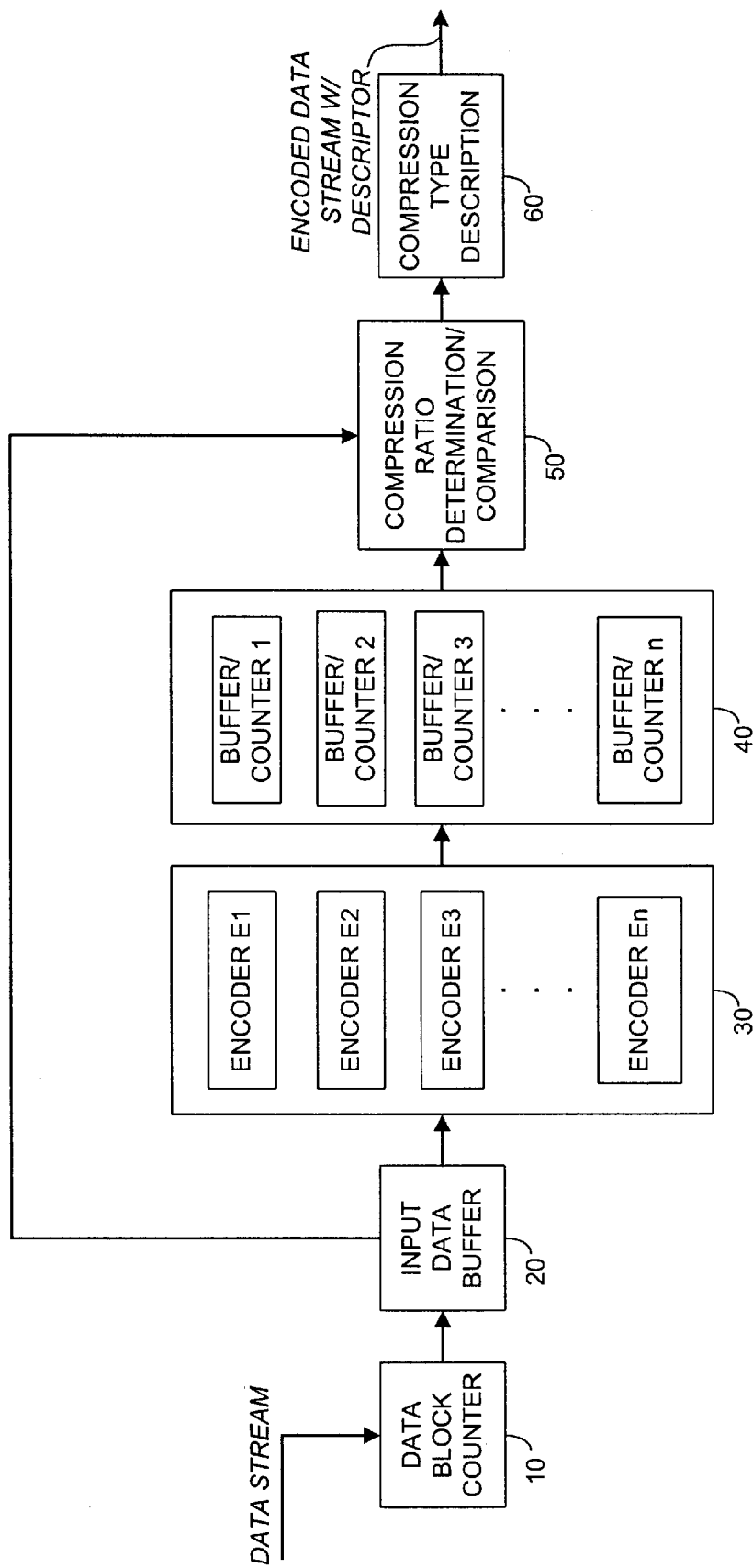
FIG. 2 is a block diagram of a content independent data compression system according to one embodiment of the present invention.

Referring now to FIG. 2 a block diagram illustrates a content independent data compression system according to one embodiment of the present invention. The data compression system includes a counter module 10 which receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds an a priori specified minimum compression ratio threshold. It is to be understood that the input data buffer 20 is not required for implementing the present invention.

An encoder module 30 is operatively connected to the buffer 20 and comprises a set of encoders E1, E2, E3 . . . En. The encoder set E1, E2, E3 . . . En may include any number "n" of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 30 successively receives as input each of the buffered input data blocks (or unbuffered input data blocks from the counter module 10). Data compression is performed by the encoder module 30 wherein each of the encoders E1 . . . En processes a given input data block and outputs a corresponding set of encoded data blocks. It is to be appreciated that the system affords a user the option to enable/disable any one or more of the encoders E1 . . . En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 30 may operate in parallel (i.e., simultaneously processing a given input data block by utilizing task multiplexing on a single central processor, via dedicated hardware, by executing on a-plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 40 is operatively connected to the encoding module 30 for buffering and counting the size of each of the encoded data blocks output from encoder module 30. Specifically, the buffer/counter 30 comprises a plurality of buffer/counters BC1, BC2, BC3 . . . BCn, each operatively associated with a corresponding one of the encoders E1 . . . En. A compression ratio module 50, operatively connected to the output buffer/counter 40, determines the compression ratio obtained for each of the enabled encoders E1 . . . En by taking the ratio of the size of the input data block to the size of the output data block stored in the corresponding buffer/counters BC1 . . . BCn. In addition, the compression ratio module 50 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 60, operatively coupled to the compression ratio module 50, appends a corresponding compression type descriptor to each encoded data block which is selected for output so as to indicate the type of compression format of the encoded data block.

Figure 3A:
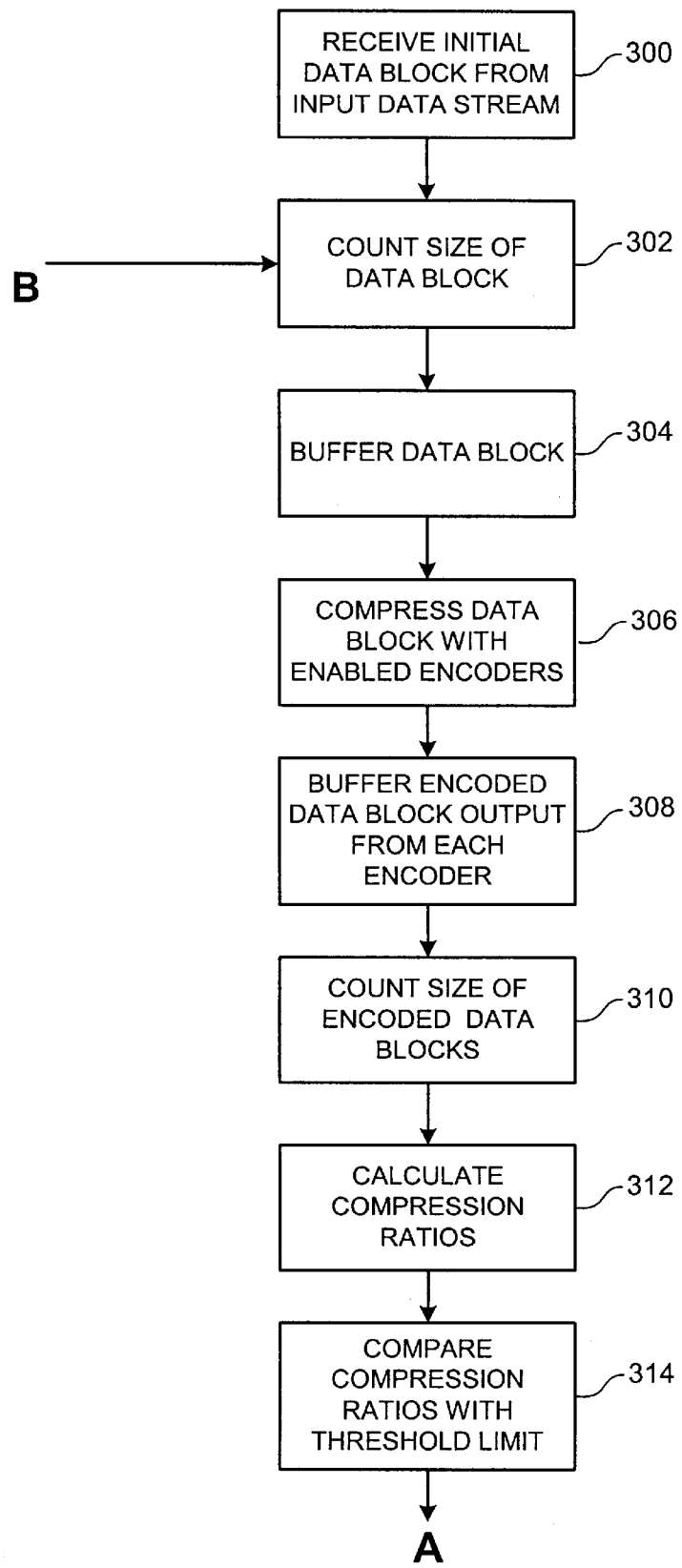
FIGS. 3a and 3b comprise a flow diagram of a data compression method according to one aspect of the present invention which illustrates the operation of the data compression system of FIG. 2.
Figure 3B:
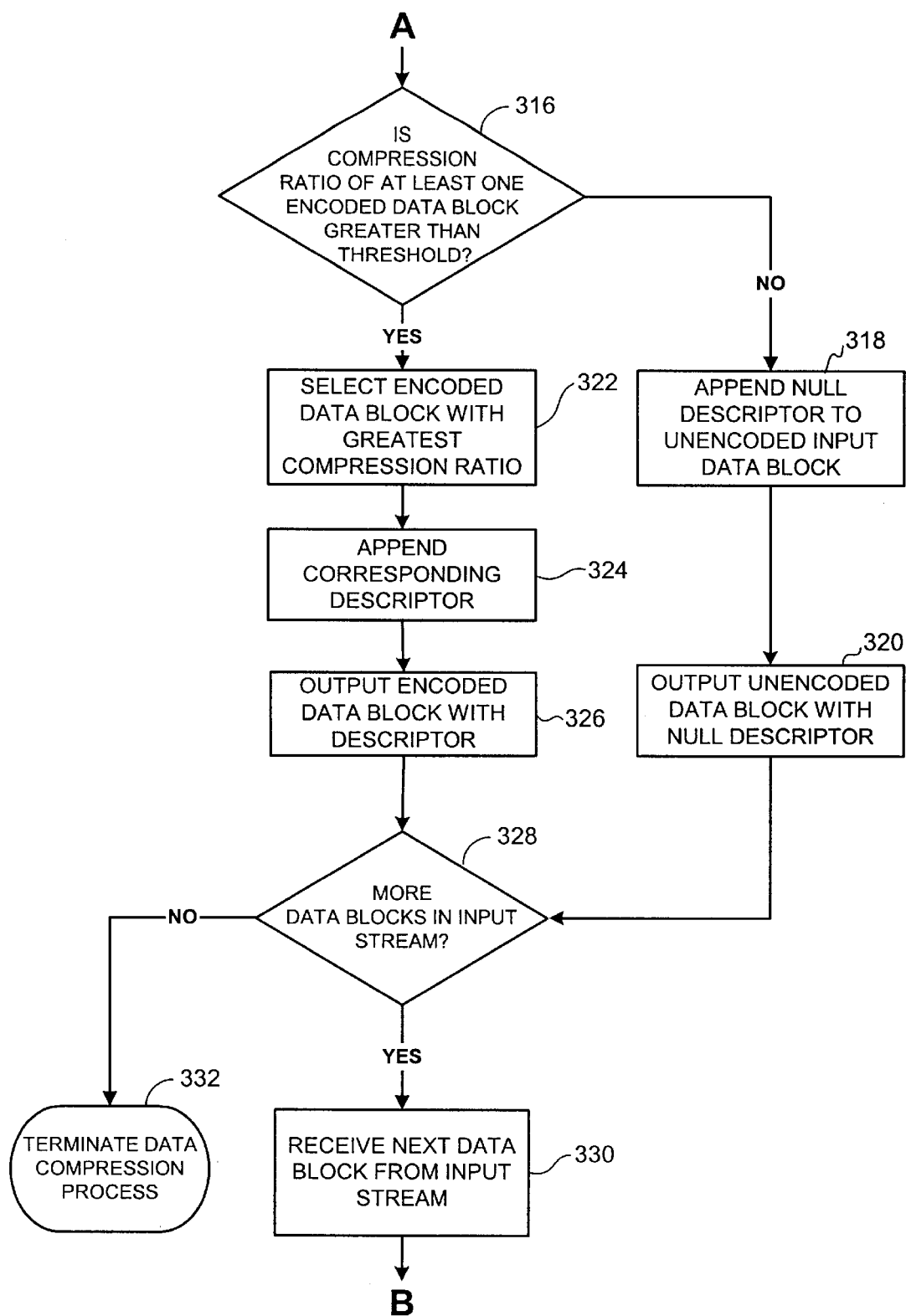

The operation of the data compression system of FIG. 2 will now be discussed in further detail with reference to the flow diagram of FIGS. 3a and 3b. A data stream comprising one or more data blocks is input into the data compression system and the first data block in the stream is received (step 300). As stated above, data compression is performed on a per data block basis. Accordingly, the first input data block in the input data stream is input into the counter module 10 which counts the size of the data block (step 302). The data block is then stored in the buffer 20 (step 304). The data block is then sent to the encoder module 30 and compressed by each (enabled) encoder E1 . . . En (step 306). Upon completion of the encoding of the input data block, an encoded data block is output from each (enabled) encoder E1 . . . En and maintained in a corresponding buffer (step 308), and the encoded data block size is counted (step 310).

Next, a compression ratio is calculated for each encoded data block by taking the ratio of the size of the input data block (as determined by the input counter 10) to the size of each encoded data block output from the enabled encoders (step 312). Each compression ratio is then compared with an a priori-specified compression ratio threshold (step 314). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art.

After the compression ratios are compared with the threshold, a determination is made as to whether the compression ratio of at least one of the encoded data blocks exceeds the threshold limit (step 316). If there are no encoded data blocks having a compression ratio that exceeds the compression ratio threshold limit (negative determination in step 316), then the original unencoded input data block is selected for output and a null data compression type descriptor is appended thereto (step 318). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 320).

On the other hand, if one or more of the encoded data blocks possess a compression ratio greater than the compression ratio threshold limit (affirmative result in step 316), then the encoded data block having the greatest compression ratio is selected (step 322). An appropriate data compression type descriptor is then appended (step 324). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 326).

After the encoded data block or the unencoded data input data block is output (steps 326 and 320), a determination is made as to whether the input data stream contains additional data blocks to be processed (step 328). If the input data stream includes additional data blocks (affirmative result in step 328), the next successive data block is received (step 330), its block size is counted (return to step 302) and the data compression process in repeated. This process is iterated for each data block in the input data stream. Once the final input data block is processed (negative result in step 328), data compression of the input data stream is finished (step 322).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 4:
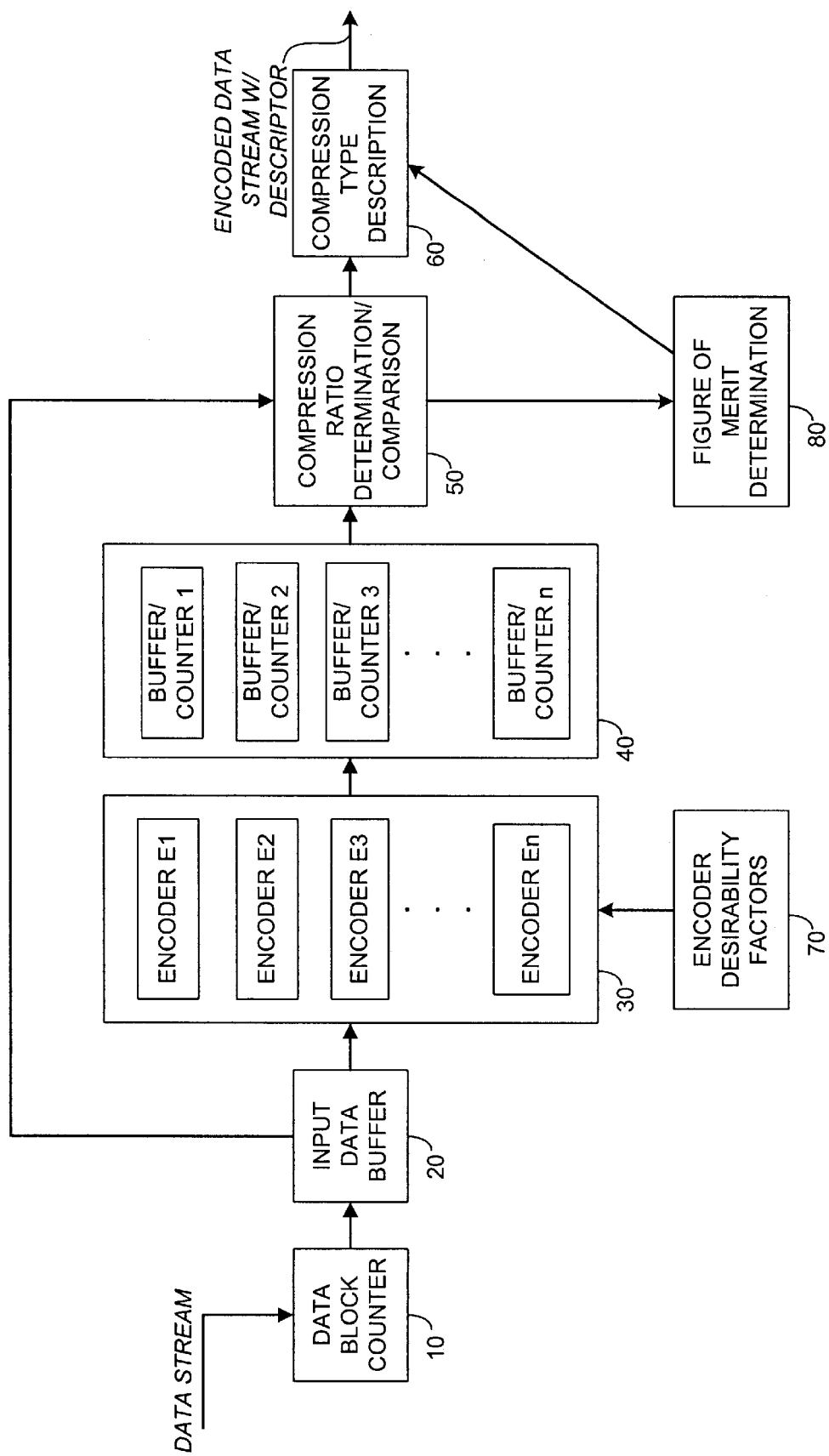
FIG. 4 is a block diagram of a content independent data compression system according to another embodiment of the present invention having an enhanced metric for selecting an optimal encoding technique.

Referring now to FIG. 4, a block diagram illustrates a content independent data compression system according to another embodiment of the present invention. The data compression system depicted in FIG. 4 is similar to the data compression system of FIG. 2 except that the embodiment of FIG. 4 includes an enhanced metric functionality for selecting an optimal encoding technique. In particular, each of the encoders E1 . . . En in the encoder module 30 is tagged with a corresponding one of user-selected encoder desirability factors 70. Encoder desirability is defined as an a priori user specified factor that takes into account any number of user considerations including, but not limited to, compatibility of the encoded data with existing standards, data error robustness, or any other aggregation of factors that the user wishes to consider for a particular application. Each encoded data block output from the encoder module 30 has a corresponding desirability factor appended thereto. A figure of merit module 80, operatively coupled to the compression ratio module 50 and the descriptor module 60, is provided for calculating a figure of merit for each of the encoded data blocks which possess a compression ratio greater than the compression ratio threshold limit. The figure of merit for each encoded data block is comprised of a weighted average of the a priori user specified threshold and the corresponding encoder desirability factor. As discussed below in further detail with reference to FIGS. 5*a* and 5*b*, the figure of merit substitutes the a priori user compression threshold limit for selecting and outputting encoded data blocks.

Figure 5A:
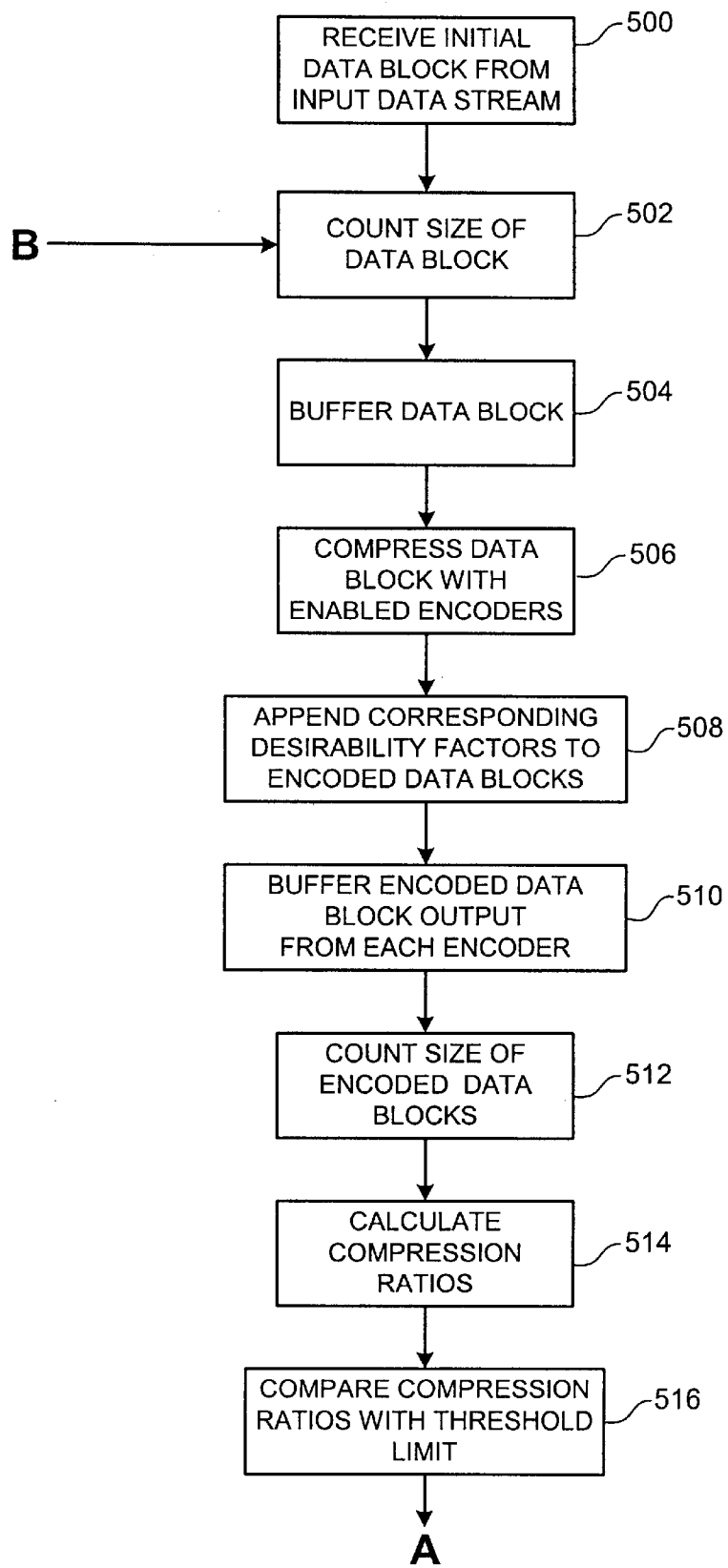
FIGS. 5a and 5b comprise a flow diagram of a data compression method according to another aspect of the present invention which illustrates the operation of the data compression system of FIG. 4.
Figure 5B:
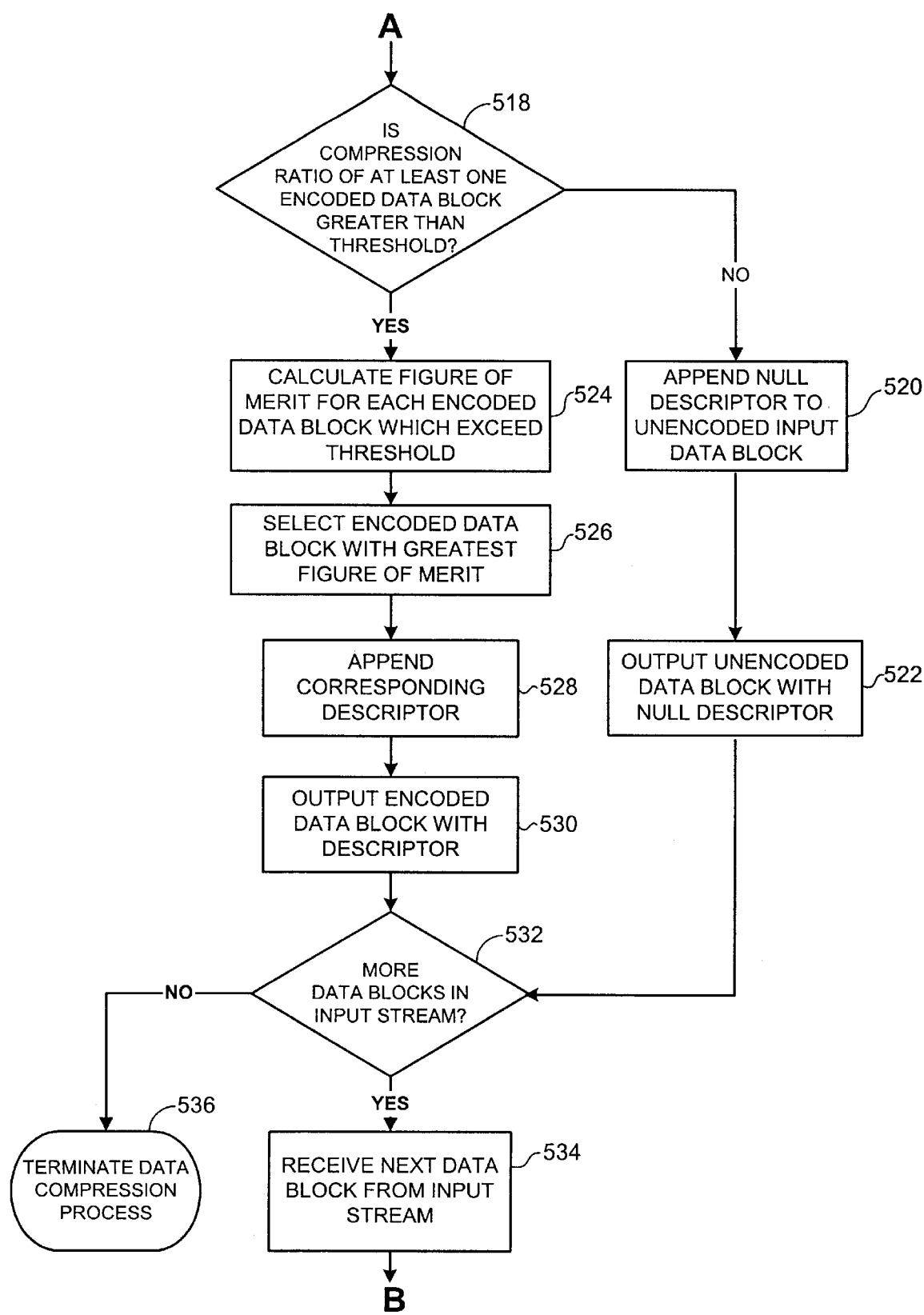

The operation of the data compression system of FIG. 4 will now be discussed in further detail with reference to the flow diagram of FIGS. 5*a* and 5*b*. A data stream comprising one or more data blocks is input into the data compression system and the first data block in the stream is received (step 500). The size of the first data block is then determined by the counter module 10 (step 502). The data block is then stored in the buffer 20 (step 504). The data block is then sent to the encoder module 30 and compressed by each (enabled) encoder in the encoder set E1 . . . En (step 506). Each encoded data block processed in the encoder module 30 is tagged with an encoder desirability factor which corresponds the particular encoding technique applied to the encoded data block (step 508). Upon completion of the encoding of the input data block, an encoded data block with its corresponding desirability factor is output from each (enabled) encoder E1 . . . En and maintained in a corresponding buffer (step 510), and the encoded data block size is counted (step 512).

Next, a compression ratio obtained by each enabled encoder is calculated by taking the ratio of the size of the input data block (as determined by the input counter 10) to the size of the encoded data block output from each enabled encoder (step 514). Each compression ratio is then compared with an a priori-specified compression ratio threshold (step 516). A determination is made as to whether the compression ratio of at least one of the encoded data blocks exceeds the threshold limit (step 518). If there are no encoded data blocks having a compression ratio that exceeds the compression ratio threshold limit (negative determination in step 518), then the original unencoded input data block is selected for output and a null data compression type descriptor (as discussed above) is appended thereto (step 520). Accordingly, the original unencoded input data with its corresponding null data compression type descriptor is then output for subsequent data processing, storage, or transmittal (step 522).

On the other hand, if one or more of the encoded data blocks possess a compression ratio greater than the compression ratio threshold limit (affirmative result in step 518), then a figure of merit is calculated for each encoded data block having a compression ratio which exceeds the compression ratio threshold limit (step 524). Again, the figure of merit for a given encoded data block is comprised of a weighted average of the a priori user specified threshold and the corresponding encoder desirability factor associated with the encoded data block. Next, the encoded data block having the greatest figure of merit is selected for output (step 526). An appropriate data compression type descriptor is then appended (step 528) to indicate the data encoding technique applied to the encoded data block. The encoded data block (which has the greatest figure of merit) along with its corresponding data compression type descriptor is then output for subsequent data processing, storage, or transmittal (step 530).

After the encoded data block or the unencoded input data block is output (steps 530 and 522), a determination is made as to whether the input data stream contains additional data blocks to be processed (step 532). If the input data stream includes additional data blocks (affirmative result in step 532), then the next successive data block is received (step 534), its block size is counted (return to step 502) and the data compression process is iterated for each successive data block in the input data stream. Once the final input data block is processed (negative result in step 532), data compression of the input data stream is finished (step 536).

Figure 6:
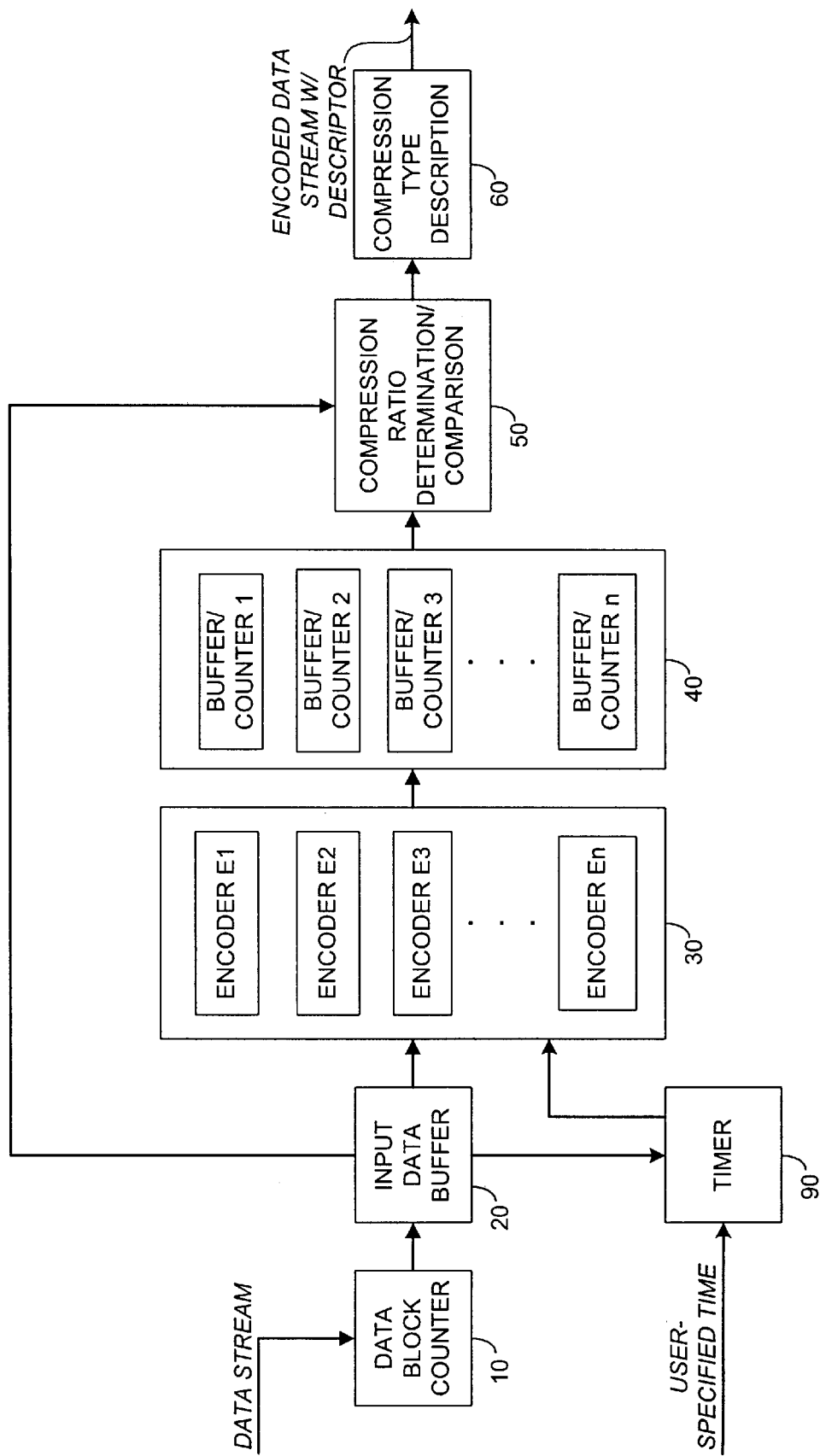
FIG. 6 is a block diagram of a content independent data compression system according to another embodiment of the present invention having an a priori specified timer that provides real-time or pseudo real-time of output data.

Referring now to FIG. 6, a block diagram illustrates a data compression system according to another embodiment of the present invention. The data compression system depicted in FIG. 6 is similar to the data compression system discussed in detail above with reference to FIG. 2 except that the embodiment of FIG. 6 includes an a priori specified timer that provides real-time or pseudo real-time output data. In particular, an interval timer 90, operatively coupled to the encoder module 30, is preloaded with a user specified time value. The role of the interval timer (as will be explained in greater detail below with reference to FIGS. 7a and 7b) is to limit the processing time for each input data block processed by the encoder module 30 so as to ensure that the real-time, pseudo real-time, or other time critical nature of the data compression processes is preserved.

Figure 7A:
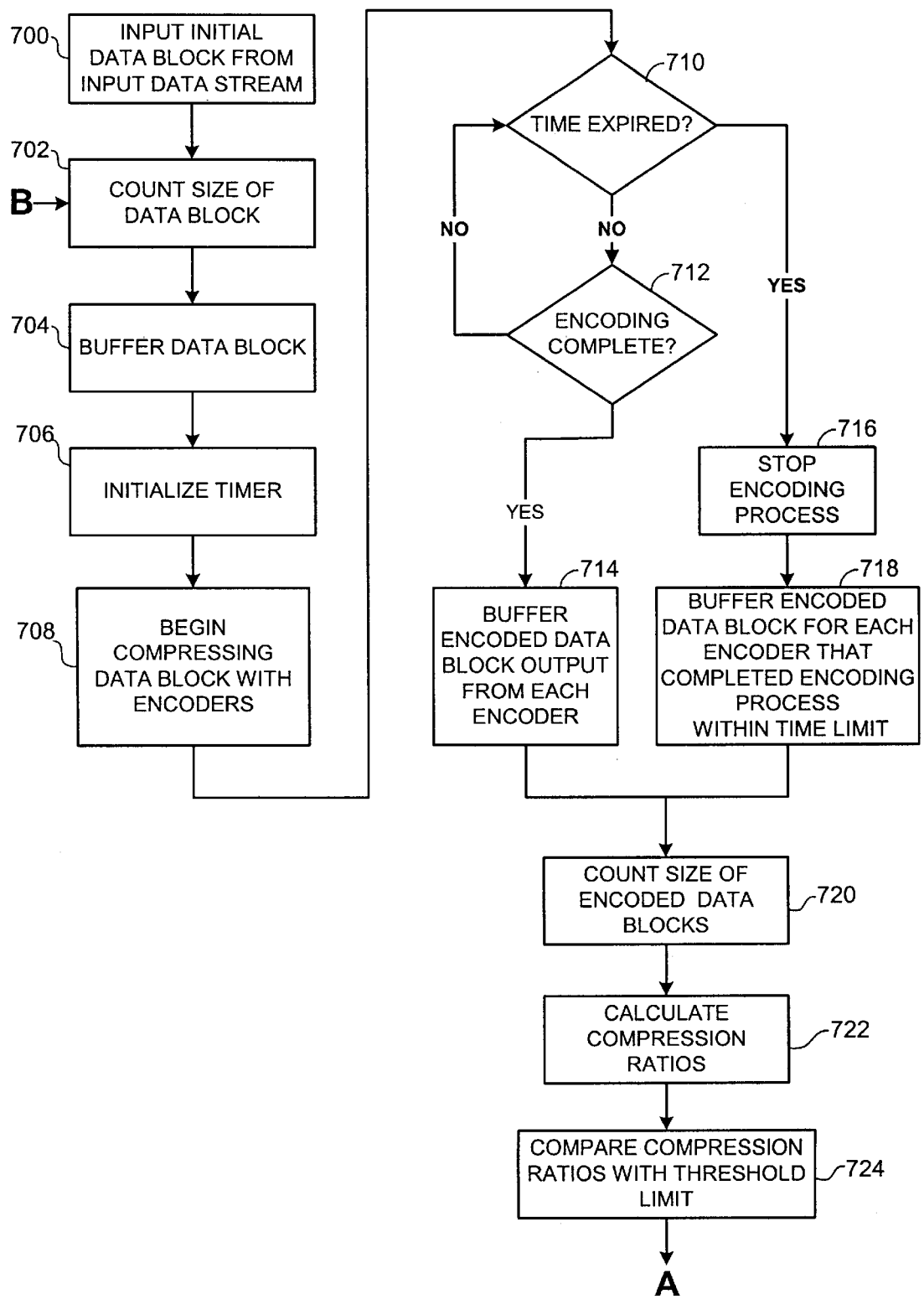
FIGS. 7a and 7b comprise a flow diagram of a data compression method according to another aspect of the present invention which illustrates the operation of the data compression system of FIG. 6.
Figure 7B:
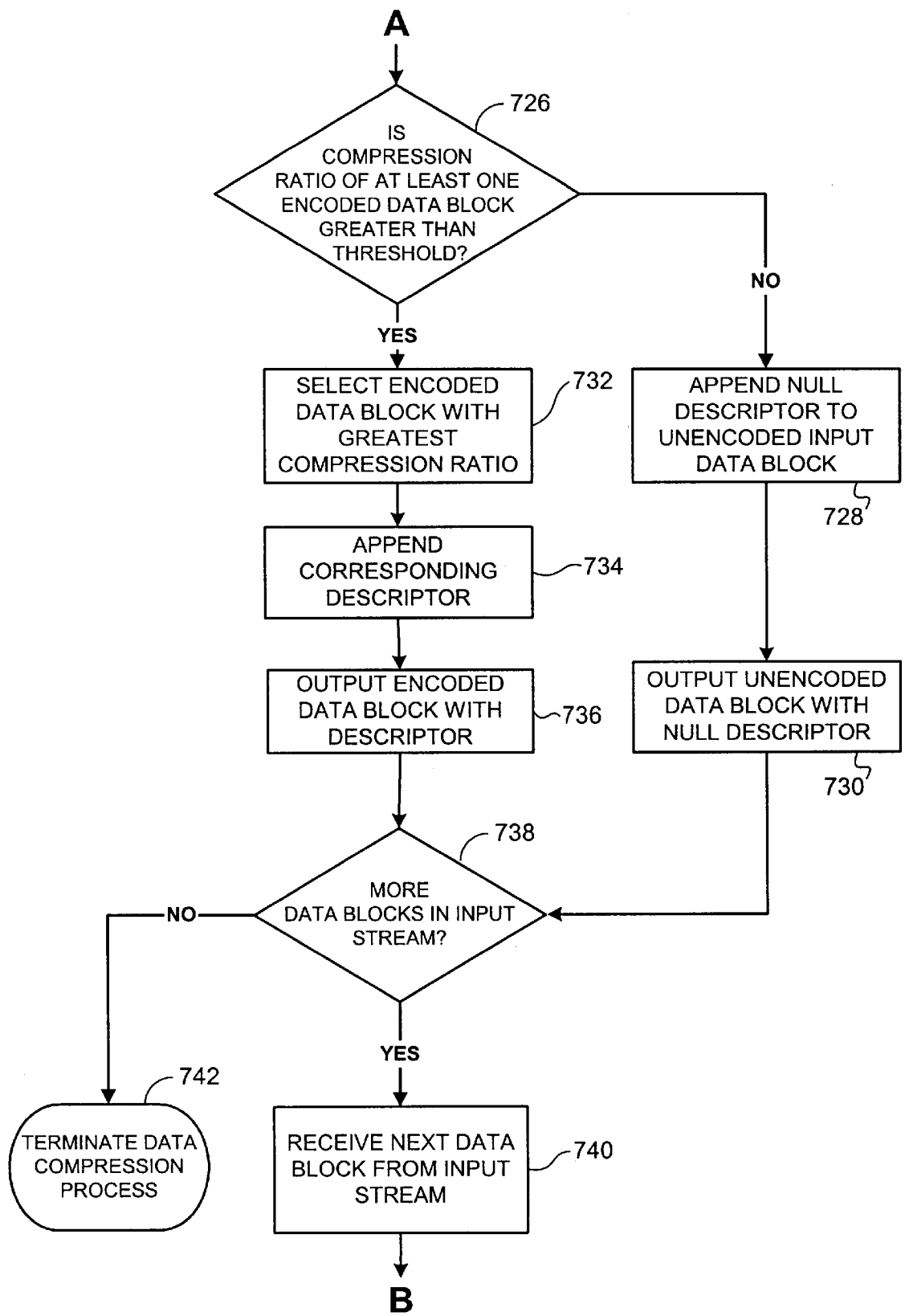

The operation of the data compression system of FIG. 6 will now be discussed in further detail with reference to the flow diagram of FIGS. 7a and 7b. A data stream comprising one or more data blocks is input into the data compression system and the first data block in the data stream is received (step 700), and its size is determined by the counter module 10 (step 702). The data block is then stored in buffer 20 (step 704).

Next, concurrent with the completion of the receipt and counting of the first data block, the interval timer 90 is initialized (step 706) and starts counting towards a user-specified time limit. The input data block is then sent to the encoder module 30 wherein data compression of the data block by each (enabled) encoder E1 . . . En commences (step 708). Next, a determination is made as to whether the user specified time expires before the completion of the encoding process (steps 710 and 712). If the encoding process is completed before or at the expiration of the timer, i.e., each encoder (E1 through En) completes its respective encoding process (negative result in step 710 and affirmative result in step 712), then an encoded data block is output from each (enabled) encoder E1 . . . En and maintained in a corresponding buffer (step 714).

On the other hand, if the timer expires (affirmative result in 710), the encoding process is halted (step 716). Then, encoded data blocks from only those enabled encoders E1 . . . En that have completed the encoding process are selected and maintained in buffers (step 718). It is to be appreciated that it is not necessary (or in some cases desirable) that some or all of the encoders complete the encoding process before the interval timer expires. Specifically, due to encoder data dependency and natural variation, it is possible that certain encoders may not operate quickly enough and, therefore, do not comply with the timing constraints of the end use. Accordingly, the time limit ensures that the real-time or pseudo real-time nature of the data encoding is preserved. the encoded data blocks are buffered (step 714 or 718), the size of each encoded data block is counted (step 720). Next, a compression ratio is calculated for each encoded data block by taking the ratio of the size of the input data block (as determined by the input counter 10) to the size of the encoded data block output from each enabled encoder (step 722). Each compression ratio is then compared with an a priori-specified compression ratio threshold (step 724). A determination is made as to whether the compression ratio of at least one of the encoded data blocks exceeds the threshold limit (step 726). If there are no encoded data blocks having a compression ratio that exceeds the compression ratio threshold limit (negative determination in step 726), then the original unencoded input data block is selected for output and a null data compression type descriptor is appended thereto (step 728). The original unencoded input data block with its corresponding null data compression type descriptor is then output for subsequent data processing, storage, or transmittal (step 730).

On the other hand, if one or more of the encoded data blocks possess a compression ratio greater than the compression ratio threshold limit (affirmative result in step 726), then the encoded data block having the greatest compression ratio is selected (step 732). An appropriate data compression type descriptor is then appended (step 734). The encoded data block having the greatest compression ratio along with its corresponding data compression type descriptor is then output for subsequent data processing, storage, or transmittal (step 736).

After the encoded data block or the unencoded input data block is output (steps 730 or 736), a determination is made as to whether the input data stream contains additional data blocks to be processed (step 738). If the input data stream includes additional data blocks (affirmative result in step 738), the next successive data block is received (step 740), its block size is counted (return to step 702) and the data compression process in repeated. This process is iterated for each data block in the input data stream, with each data block being processed within the user-specified time limit as discussed above. Once the final input data block is processed (negative result in step 738), data compression of the input data stream is complete (step 742).

Figure 8:
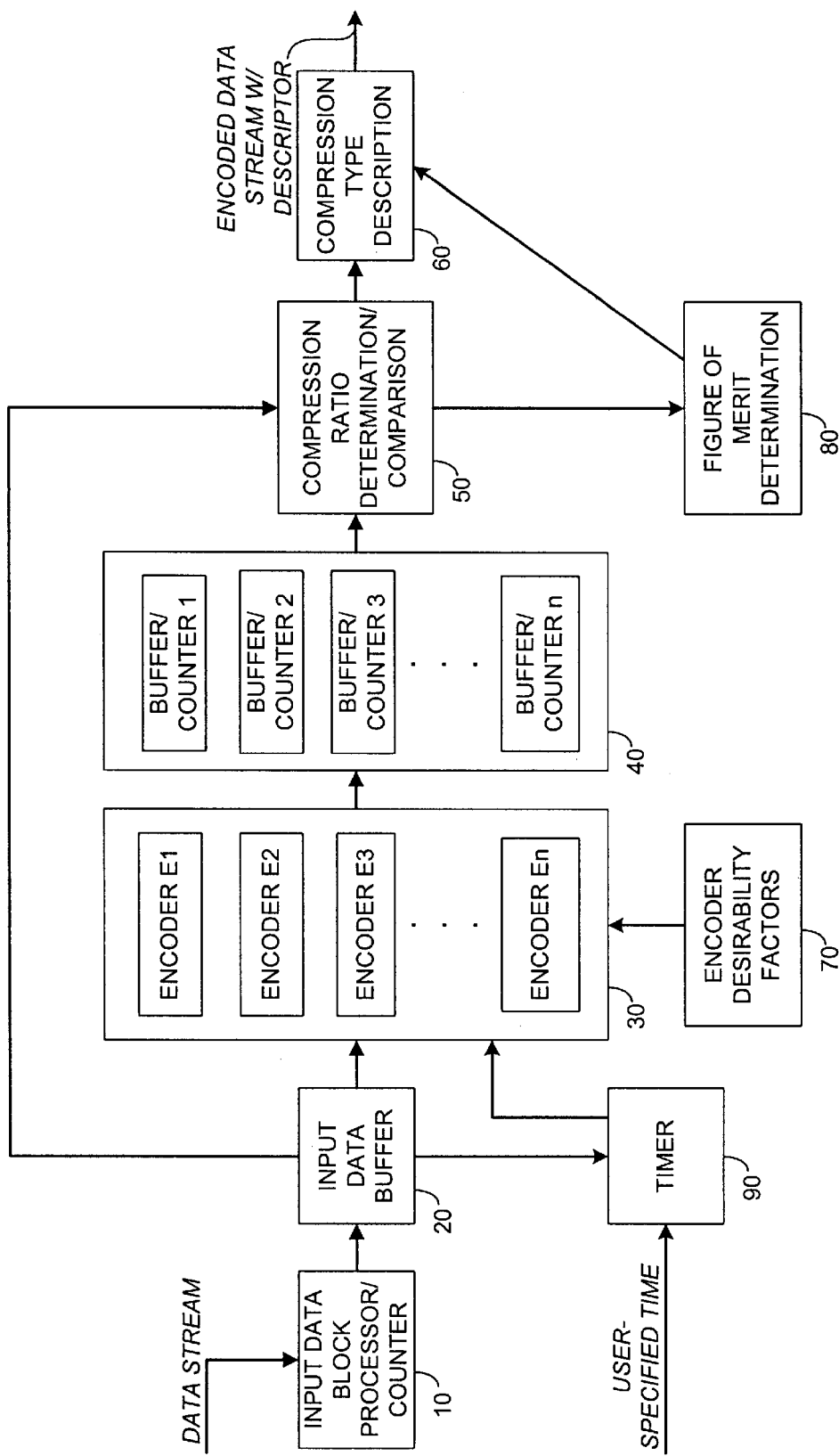
FIG. 8 is a block diagram of a content independent data compression system according to another embodiment having an a priori specified timer that provides real-time or pseudo real-time of output data and an enhanced metric for selecting an optimal encoding technique.

Referring now to FIG. 8, a block diagram illustrates a content independent data compression system according to another embodiment of the present system. The data compression system of FIG. 8 incorporates all of the features discussed above in connection with the system embodiments of FIGS. 2, 4, and 6. For example, the system of FIG. 8 incorporates both the a priori specified timer for providing real-time or pseudo real-time of output data, as well as the enhanced metric for selecting an optimal encoding technique. Based on the foregoing discussion, the operation of the system of FIG. 8 is understood by those skilled in the art.

Figure 9:
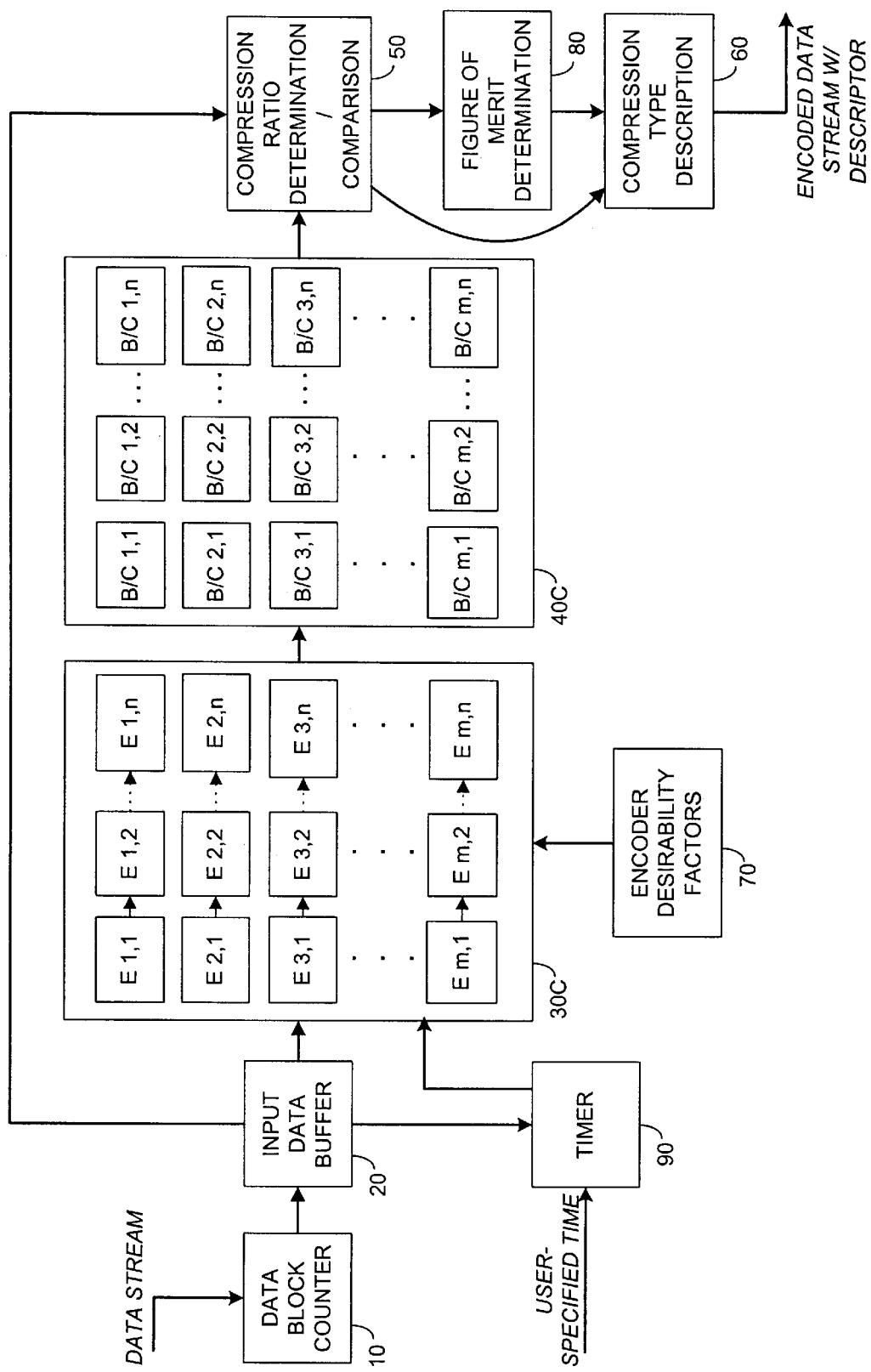
FIG. 9 is a block diagram of a content independent data compression system according to another embodiment of the present invention having an encoding architecture comprising a plurality of sets of serially-cascaded encoders.

Referring now to FIG. 9, a block diagram illustrates a data compression system according to a preferred embodiment of the present invention. The system of FIG. 9 contains many of the features of the previous embodiments discussed above. However, this embodiment advantageously includes a cascaded encoder module 30c having an encoding architecture comprising a plurality of sets of serially-cascaded encoders Em,n, where "m" refers to the encoding path (i.e., the encoder set) and where "n" refers to the number of encoders in the respective path. It is to be understood that each set of serially-cascaded encoders can include any number of disparate and/or similar encoders (i.e., n can be any value for a given path m).

The system of FIG. 9 also includes a output buffer module 40c which comprises a plurality of buffer/counters B/C m,n, each associated with a corresponding one of the encoders Em,n. In this embodiment, an input data block is sequentially applied to successive encoders (encoder stages) in the encoder path so as to increase the data compression ratio. For example, the output data block from a first encoder E1,1, is buffered and counted in B/C1,1, for subsequent processing by a second encoder E1,2. Advantageously, these parallel sets of sequential encoders are applied to the input data stream to effect content free lossless data compression. This embodiment provides for multi-stage sequential encoding of data with the maximum number of encoding steps subject to the available real-time, pseudo real-time, or other timing constraints.

As with each previously discussed embodiment, the encoders Em,n may include those lossless encoding techniques currently well known within the art, including: run length, Huffman, Lempel-Ziv Dictionary Compression, arithmetic coding, data compaction, and data null suppression. Encoding techniques are selected based upon their ability to effectively encode different types of input data. A full complement of encoders provides for broad coverage of existing and future data types. The input data blocks may be applied simultaneously to the encoder paths (i.e., the encoder paths may operate in parallel, utilizing task multiplexing on a single central processor, or via dedicated hardware, or by executing on a plurality of processor or dedicated hardware systems, or any combination thereof). In addition, an input data block may be sequentially applied to the encoder paths. Moreover, each serially-cascaded encoder path may comprise a fixed (predetermined) sequence of encoders or a random sequence of encoders. Advantageously, by simultaneously or sequentially processing input data blocks via a plurality of sets of serially-cascaded encoders, content free data compression is achieved.

Figure 10A:
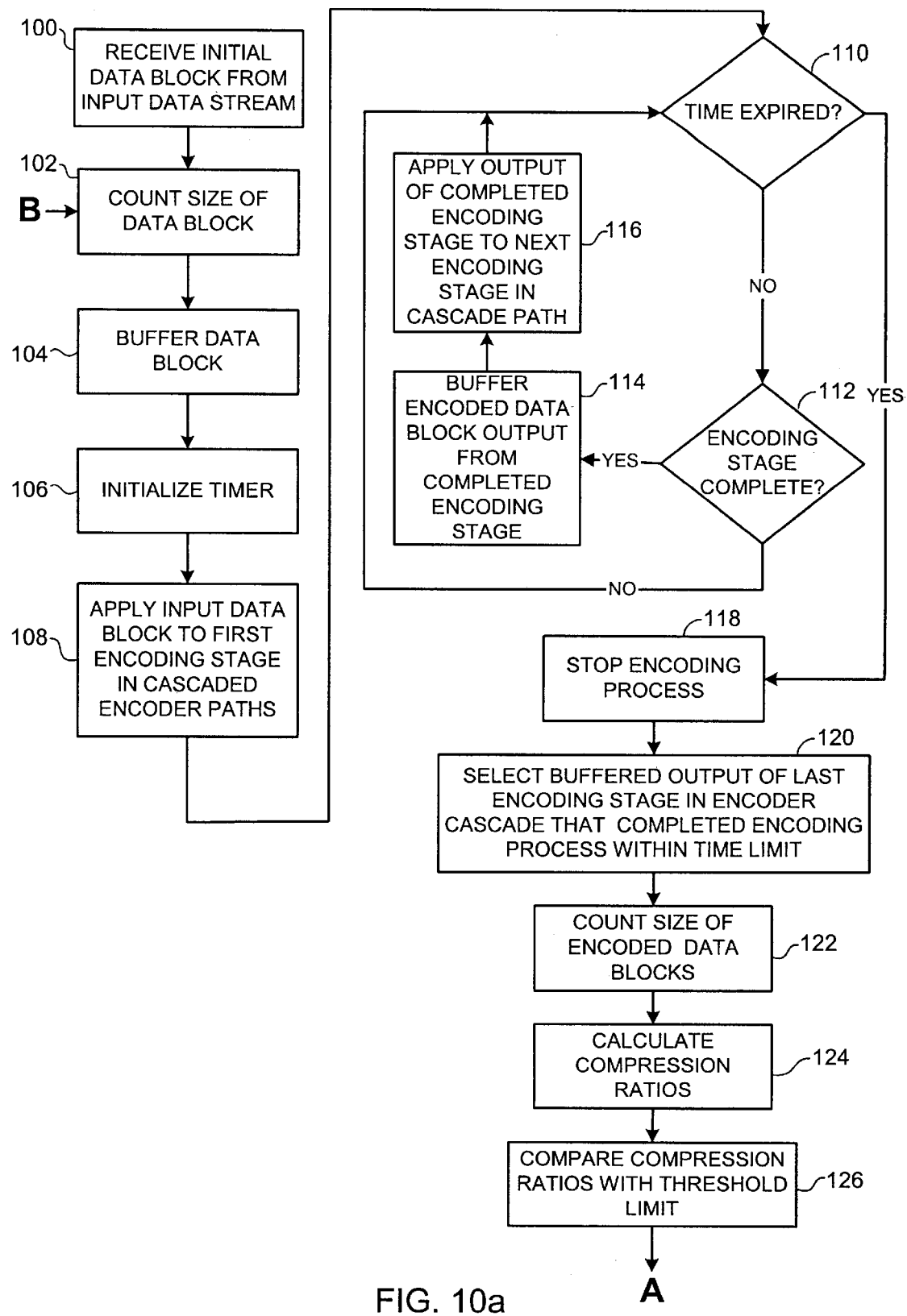
FIGS. 10a and 10b comprise a flow diagram of a data compression method according to another aspect of the present invention which illustrates the operation of the data compression system of FIG. 9.
Figure 10B:
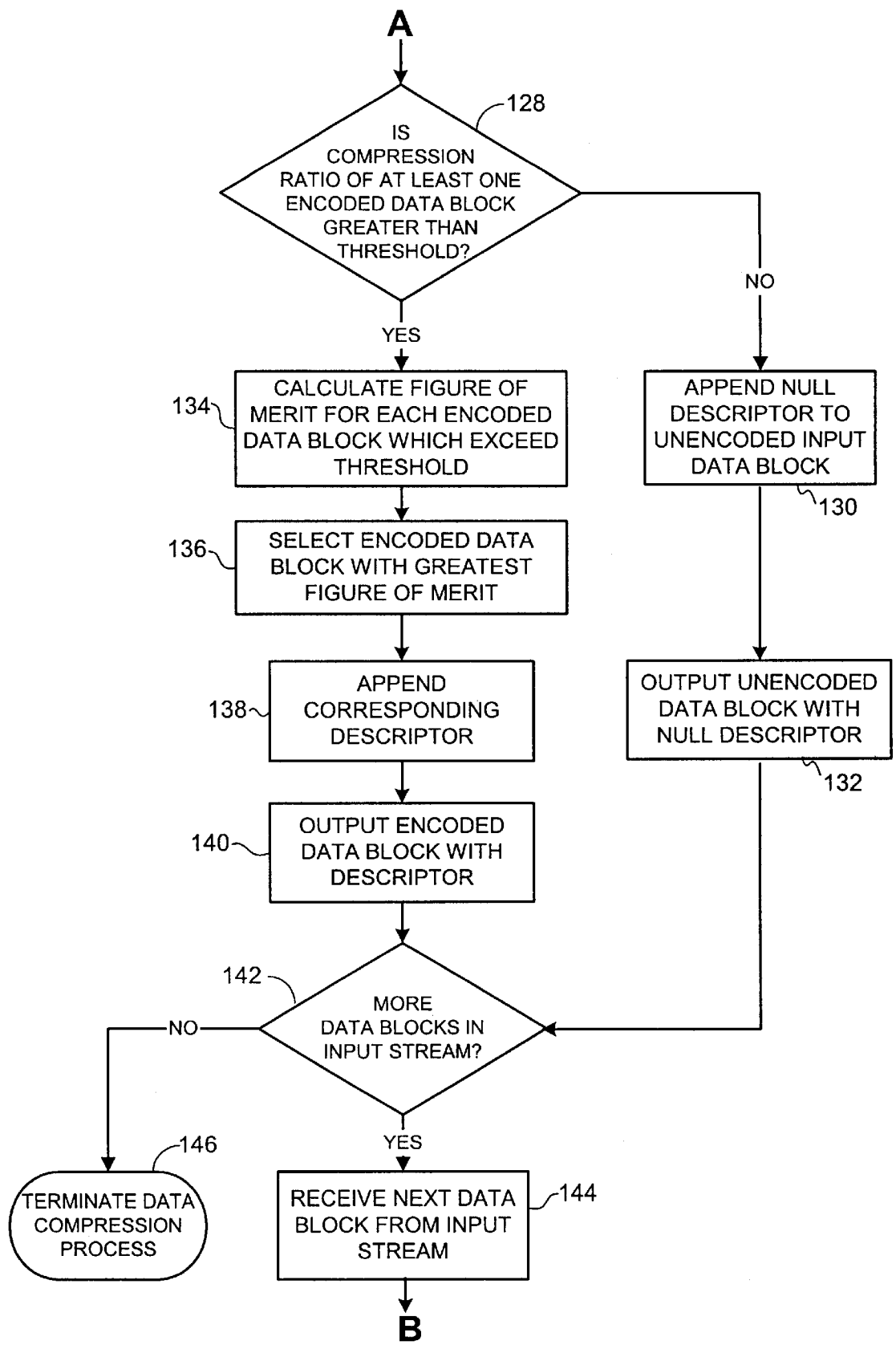

The operation of the data compression system of FIG. 9 will now be discussed in further detail with reference to the flow diagram of FIGS. 10a and 10b. A data stream comprising one or more data blocks is input into the data compression system and the first data block in the data stream is received (step 100), and its size is determined by the counter module 10 (step 102). The data block is then stored in buffer 20 (step 104).

Next, concurrent with the completion of the receipt and counting of the first data block, the interval timer 90 is initialized (step 106) and starts counting towards a user-specified time limit. The input data block is then sent to the cascade encoder module 30C wherein the input data block is applied to the first encoder (i.e., first encoding stage) in each of the cascaded encoder paths E1,1 . . . Em,1 (step 108). Next, a determination is made as to whether the user specified time expires before the completion of the first stage encoding process (steps 110 and 112). If the first stage encoding process is completed before the expiration of the timer, i.e., each encoder (E1,1 . . . Em,1) completes its encoding process (negative result in step 110 and affirmative result in step 112), then an encoded data block is output from each encoder E1,1 . . . Em,1 and maintained in a corresponding buffer (step 114). Then for each cascade encoder path, the output of the completed encoding stage is applied to the next successive encoding stage in the cascade path (step 116). This process (steps 110, 112, 114, and 116) is repeated until the earlier of the timer expiration (affirmative result in step 110) or the completion of encoding by each encoder stage in the serially-cascaded paths, at which time the encoding process is halted (step 118).

Then, for each cascade encoder path, the buffered encoded data block output by the last encoder stage that completes the encoding process before the expiration of the timer is selected for further processing (step 120).

Advantageously, the interim stages of the multi-stage data encoding process are preserved. For example, the results of encoder E1,1 are preserved even after encoder E1,2 begins encoding the output of encoder E1,1. If the interval timer expires after encoder E1,1 completes its respective encoding process but before encoder E1,2 completes its respective encoding process, the encoded data block from encoder E1,1 is complete and is utilized for calculating the compression ratio for the corresponding encoder path. The incomplete encoded data block from encoder E1,2 is either discarded or ignored.

It is to be appreciated that it is not necessary (or in some cases desirable) that some or all of the encoders in the cascade encoder paths complete the encoding process before the interval timer expires. Specifically, due to encoder data dependency, natural variation and the sequential application of the cascaded encoders, it is possible that certain encoders may not operate quickly enough and therefore do not comply with the timing constraints of the end use. Accordingly, the time limit ensures that the real-time or pseudo real-time nature of the data encoding is preserved.

After the encoded data blocks are selected (step 120), the size of each encoded data block is counted (step 122). Next, a compression ratio is calculated for each encoded data block by taking the ratio of the size of the input data block (as determined by the input counter 10) to the size of the encoded data block output from each encoder (step 124). Each compression ratio is then compared with an a priori-specified compression ratio threshold (step 126). A determination is made as to whether the compression ratio of at least one of the encoded data blocks exceeds the threshold limit (step 128). If there are no encoded data blocks having a compression ratio that exceeds the compression ratio threshold limit (negative determination in step 128), then the original unencoded input data block is selected for output and a null data compression type descriptor is appended thereto (step 130). The original unencoded data block and its corresponding null data compression type descriptor is then output for subsequent data processing, storage, or transmittal (step 132).

On the other hand, if one or more of the encoded data blocks possess a compression ratio greater than the compression ratio threshold limit (affirmative result in step 128), then a figure of merit is calculated for each encoded data block having a compression ratio which exceeds the compression ratio threshold limit (step 134). Again, the figure of merit for a given encoded data block is comprised of a weighted average of the a priori user specified threshold and the corresponding encoder desirability factor associated with the encoded data block. Next, the encoded data block having the greatest figure of merit is selected (step 136). An appropriate data compression type descriptor is then appended (step 138) to indicate the data encoding technique applied to the encoded data block. For instance, the data type compression descriptor can indicate that the encoded data block was processed by either a single encoding type, a plurality of sequential encoding types, and a plurality of random encoding types. The encoded data block (which has the greatest figure of merit) along with its corresponding data compression type descriptor is then output for subsequent data processing, storage, or transmittal (step 140).

After the unencoded data block or the encoded data input data block is output (steps 132 and 140), a determination is made as to whether the input data stream contains additional data blocks to be processed (step 142). If the input data stream includes additional data blocks (affirmative result in step 142), then the next successive data block is received (step 144), its block size is counted (return to step 102) and the data compression process is iterated for each successive data block in the input data stream. Once the final input data block is processed (negative result in step 142), data compression of the input data stream is finished (step 146).

Figure 11:
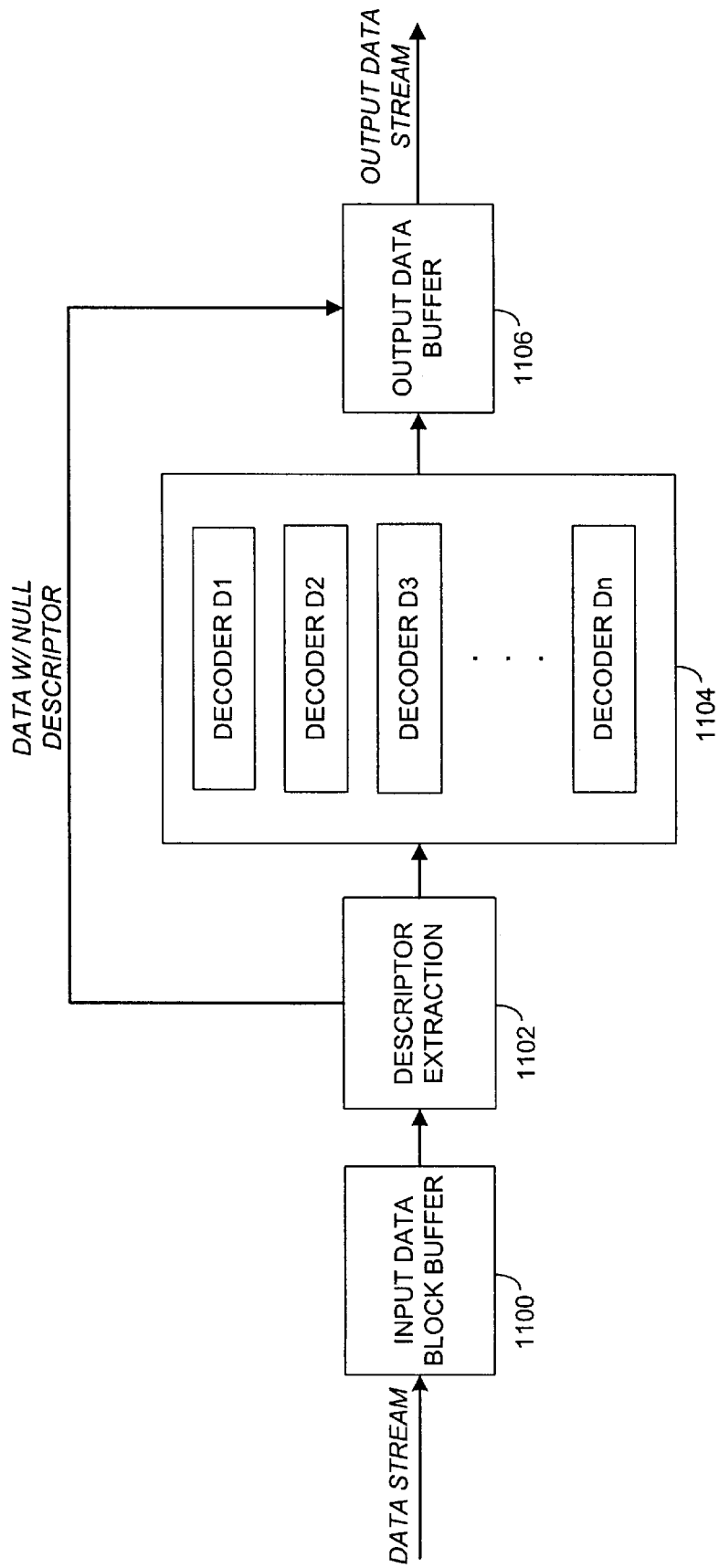
FIG. 11 is block diagram of a content independent data decompression system according to one embodiment of the present invention.

Referring now to FIG. 11, a block diagram illustrates a data decompression system according to one embodiment of the present invention. The data decompression system preferably includes an input buffer 1100 which receives as input an uncompressed or compressed data stream comprising one or more data blocks. The data blocks may range in size from individual bits through complete files or collections of multiple files. Additionally, the data block size may be fixed or variable. The input data buffer 1100 is preferably included (not required) to provide storage of input data for various hardware implementations. A descriptor extraction module 1102 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 1104 includes a plurality of decoders D1 ... Dn for decoding the input data block using a decoder, set of decoders, or a sequential set of decoders corresponding to the extracted compression type descriptor. The decoders D1 ... Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source. As with the data compression systems discussed above, the decoder module 1104 may include multiple decoders of the same type applied in parallel so as to reduce the data decoding time.

The data decompression system also includes an output data buffer 1106 for buffering the decoded data block output from the decoder module 1104.

Figure 12:
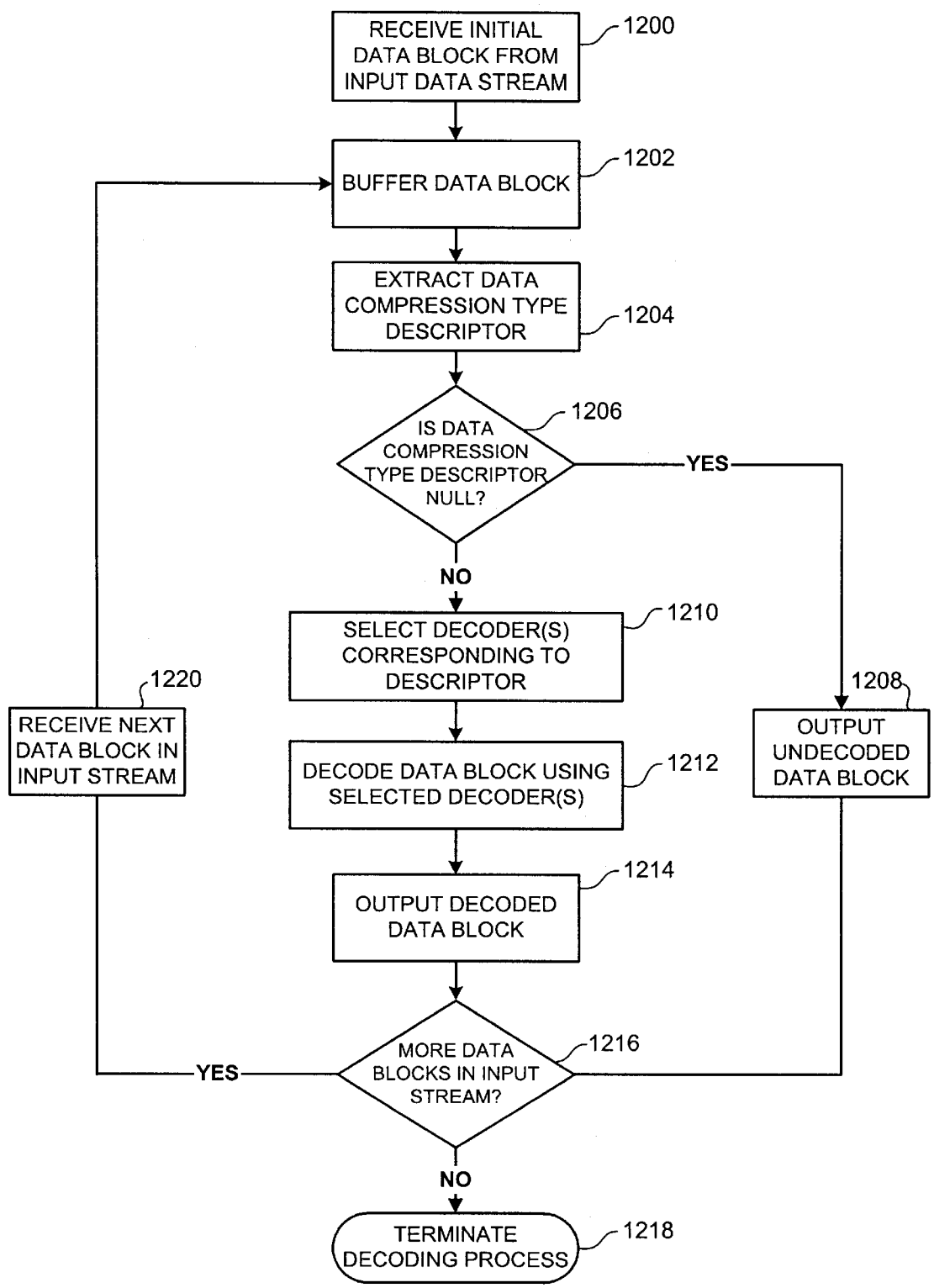
FIG. 12 is a flow diagram of a data decompression method according to one aspect of the present invention which illustrates the operation of the data compression system of FIG. 11.

The operation of the data decompression system of FIG. 11 will be discussed in further detail with reference to the flow diagram of FIG. 12. A data stream comprising one or more data blocks of compressed or uncompressed data is input into the data decompression system and the first data block in the stream is received (step 1200) and maintained in the buffer (step 1202). As with the data compression systems discussed above, data decompression is performed on a per data block basis. The data compression type descriptor is then extracted from the input data block (step 1204). A determination is then made as to whether the data compression type descriptor is null (step 1206). If the data compression type descriptor is determined to be null (affirmative result in step 1206), then no decoding is applied to the input data block and the original undecoded data block is output (or maintained in the output buffer) (step 1208).

On the other hand, if the data compression type descriptor is determined to be any value other than null (negative result in step 1206), the corresponding decoder or decoders are then selected (step 1210) from the available set of decoders D1 ... Dn in the decoding module 1104. It is to be understood that the data compression type descriptor may mandate the application of: a single specific decoder, an ordered sequence of specific decoders, a random order of specific decoders, a class or family of decoders, a mandatory or optional application of parallel decoders, or any combination or permutation thereof. The input data block is then decoded using the selected decoders (step 1212), and output (or maintained in the output buffer 1106) for subsequent data processing, storage, or transmittal (step 1214). A determination is then made as to whether the input data stream contains additional data blocks to be processed (step 1216). If the input data stream includes additional data blocks (affirmative result in step 1216), the next successive data block is received (step 1220), and buffered (return to step 1202). Thereafter, the data decompression process is iterated for each data block in the input data stream. Once the final input data block is processed (negative result in step 1216), data decompression of the input data stream is finished (step 1218).

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A program storage device readable by machine, tangibly embodying a program of instructions executable by the machine to perform method steps for providing content independent data compression, said method steps comprising:

receiving as input a block of data from a stream of data;

encoding said input data block with a plurality of encoders to provide a plurality of encoded data blocks;

determining a compression ratio obtained for each of said encoders comparing each of said determined compression ratios with an a priori user specified compression threshold;

selecting for output said input data block and appending a null compression descriptor to said input data block, if all of said encoder compression ratios fall below said a priori specified compression threshold; and selecting for output said encoded data block having the highest compression ratio and appending a corresponding compression type descriptor to said selected encoded data block, if at least one of said compression ratios exceed said a priori specified compression threshold.

2. The program storage device of claim 1, further comprising instructions for performing the steps of:

initializing a timer with a user-specified time interval upon commencing the encoding of said input data block; and terminating said encoding step upon the earlier of one of the expiration of said timer and the completion of said encoding of said input data block by all of said plurality of encoders, wherein the step of determining the compression ratios is only performed for the encoders that have completed encoding of said input data block before expiration of said timer.

3. A program storage device readable by machine, tangibly embodying a program of instructions executable by the machine to perform method steps for providing content independent data compression, said method steps comprising:

receiving as input a block of data from a stream of data;

compressing said input data block with a plurality of encoders and appending a corresponding encoder desirability factor to said encoded data block output from each of said encoders;

determining a compression ratio obtained by each of said encoders;

comparing each of said determined compression ratios with an a priori user specified compression threshold;

selecting for output said input data block and appending a null compression descriptor to said input data block, if all of said encoder compression ratios fall below said a priori specified compression threshold;

calculating a figure of merit for each encoded data block having a compression ratio associated therewith that meets said a priori user specified compression threshold, said figure of merit comprising a weighted average of said a priori user specified compression threshold and said corresponding encoder desirability factor; and selecting for output said encoded data block having the highest figure of merit and appending a corresponding compression type descriptor to said selected encoded data block.

4. The program storage device of claim 3, further comprising instructions for performing the steps of:

initializing a timer with a user-specified time interval upon commencing the encoding of said input data block; and terminating said encoding step upon the earlier of one of the expiration of said timer and the completion of said encoding of said input data block by all of said plurality of encoders;

wherein the step of determining the compression ratios is performed only for the encoders that have completed encoding of said input data block before expiration of said timer.

5. A program storage device readable by machine, tangibly embodying a program of instructions executable by the machine to perform method steps for providing content independent data compression, said method steps comprising:

receiving as input a block of data from a stream of data;

compressing said input data block with a plurality of encoders, wherein each encoder comprises a plurality of serially-cascaded encoders;

appending a corresponding encoder desirability factor to each of said encoded data blocks output from each of said encoders;

determining a data compression ratio obtained by each of said encoders;

comparing each of said determined compression ratios with an a priori user specified compression threshold;

selecting for output said input data block and appending a null compression descriptor to said input data block, if all of said compression ratios fall below said a priori specified compression threshold;

calculating a figure of merit for each encoded data block which exceeds said a priori user specified compression threshold, said figure of merit comprising a weighted average of said a priori user specified threshold and said corresponding encoder desirability factor; and selecting for output said encoded data block having the highest figure of merit and appending a corresponding compression type descriptor to said selected encoded data block.

6. The program storage device of claim 5, wherein said corresponding compression type descriptor indicates one of a single encoding type descriptor, a plurality of sequential encoding types descriptor, and a plurality of random encoding types descriptor.

7. The program storage device of claim 5, further comprising instructions for performing the steps of:

initializing a timer with a user-specified time interval upon commencing encoding of said input data block;

buffering the encoded data block output from each serially-cascaded encoder;

terminating said encoding by a serially-cascaded encoder upon the earlier of one of the expiration of said timer and the completion of said encoding of said input data block by the serially-cascaded encoder, wherein the step of determining the compression ratios for each encoder is performed by determining the compression ratio for the corresponding last serially-cascaded encoder that has completed encoding of said input data block before expiration of said timer.

8. A method for compressing data, comprising the steps of:

receiving an input data stream comprising a plurality of disparate data types;

compressing the input data stream using each of a plurality of different encoders;

generating an encoded data stream by selectively combining compressed data blocks output from each of the encoders based on compression ratios obtained by the encoders.

9. The method of claim 8, wherein the step of compressing the input data stream comprises compressing each data block in the input data stream using each of the encoders, and wherein the step of generating the encoded data stream comprises:

for each data block in the input stream,
determining a compression ratio obtained from each of the encoders;

selecting for output the input data block and appending a null compression descriptor to input the data block, if no compression ratio exceeds a predetermined threshold; and selecting for output the encoded data block having the greatest compression ratio associated therewith that meets the predetermined threshold and appending a compression type descriptor to the selected encoded data block.

10. The method of claim 9, further comprising the step of applying a predetermined timing constraint to the compression process to provide real-time data compression of the input data stream.

11. The method of 10, wherein the step of applying a predetermined time constraint comprises the steps of:

initializing a timer with a user-specified time interval upon commencing compression of an input data block; and terminating said encoding step upon the earlier of one of the expiration of said timer and the completion of said encoding of said input data block by all of said plurality of encoders; wherein the step of determining the compression ratios is only performed for the encoders that have completed encoding of said input data block before expiration of said timer.

12. The method of claim 8, wherein the step of generating the encoded data stream comprises tagging each compressed data block with a compression type descriptor.

13. The method of claim 8, wherein the step of generating the encoded data stream comprises combining uncompressed data blocks from the input data stream with the compressed data blocks and tagging each uncompressed data block with a null compression descriptor.

* * * * *